United States Patent
Hughes

[19]

[11] Patent Number: 6,111,438
[45] Date of Patent: *Aug. 29, 2000

[54] CURRENT MEMORY AND CIRCUIT ARRANGEMENT COMPRISING CURRENT MEMORIES

[75] Inventor: John B. Hughes, Hove, United Kingdom

[73] Assignee: U.S. Philips Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/062,947

[22] Filed: Apr. 20, 1998

[30] Foreign Application Priority Data

May 30, 1997 [GB] United Kingdom .................... 9711060

[51] Int. Cl.⁷ ..................................................... H03B 1/00
[52] U.S. Cl. .............................. 327/108; 327/112; 326/87
[58] Field of Search .................................. 327/108, 112, 327/272, 274, 278, 280; 326/21, 24, 26, 27, 86, 87

[56] References Cited

U.S. PATENT DOCUMENTS 5,400,273   3/1995   Hughes et al. .............................. 365/45
5,420,525   5/1995   Maloberti et al. .......................... 326/27
5,434,534   7/1995   Lucas ......................................... 327/546
5,872,473   2/1999   Williams .................................... 327/108
5,880,606   3/1999   Griesbach ................................... 326/86

OTHER PUBLICATIONS

"On–Chip Voltage Regulators With Improved Ripple Rejection", IBM–TBD, vol. 32, No. 10A, Mar. 1990, pp. 26–28.

Primary Examiner—Timothy P. Callahan
Assistant Examiner—An T. Luu
Attorney, Agent, or Firm—Brian J. Wieghaus

[57] ABSTRACT

A current memory cell comprises a fine MOS memory transistor (T1) and a coarse MOS memory transistor (T2) connected in series between two power supply rails. Such current memory cells are preferably designed so that the sum of the voltage drops across the coarse and fine memory transistors when diode connected is equal to the supply voltage. In order to achieve this while leaving flexibility in choosing the transistor saturation voltages an auxiliary power rail ($V_{dda}$) is generated using as a reference the voltage drops across two diode connected transistors (T6, T7) which conduct a current equal to the bias current in the current memory cell (3).

12 Claims, 2 Drawing Sheets

6,111,438

CURRENT MEMORY AND CIRCUIT ARRANGEMENT COMPRISING CURRENT MEMORIES

BACKGROUND OF THE INVENTION

The invention relates to a current memory cell comprising a fine MOS memory transistor and a coarse MOS memory transistor connected in series between two power supply rails, an input coupled to the junction of the drain electrodes of the fine and coarse memory transistors via a switch which is closed during a first portion of a clock period, a second switch connected between the gate and drain electrodes of the coarse memory transistor which is closed during a first part of the first portion, a third switch connected between the gate and drain electrodes of the fine memory transistor which is closed during a second part of the first portion and an output coupled to the junction of the drain electrodes of the coarse and fine memory transistors via a fourth switch which is closed during a second portion of the clock period.

The invention further relates to a circuit arrangement comprising a plurality of current memory cells.

Such a current memory cell is disclosed in EP-A-608936. These current memory cells are normally designed such that under quiescent conditions the sum of the voltage drops across the diode connected coarse and fine transistors matches the supply voltage. That is, $V_{gsn}+V_{gsp}=V_{dd}$. This condition is ensured by the choice of transistor saturation voltages which together with the memory capacitance determines the memory cell's signal to noise ratio. However, the layout parasitic capacitance sometimes gives larger total memory capacitance than is needed to meet the signal to noise ratio specification and adherence to the above condition results in an over design of signal to noise ratio and an undesirably high power consumption.

If the alternative strategy of reducing $V_{gsn}$ and $V_{gsp}$ to achieve the desired signal to noise ratio while obtaining a lower power consumption is chosen, this results in the sum of $V_{gsn}$ and $V_{gsp}$ being less than $V_{dd}$. Under these circumstances, during operation of the memory cell, there is a voltage jump at the summing node from the coarse input phase to the fine input phase and again from the fine input phase to the output phase. This produces undesirable behaviour including increased power consumption and harmonic distortion.

SUMMARY OF THE INVENTION

It is an object of the invention to enable the provision of a current memory cell of the type set forth in the opening paragraph which mitigates at least some of the disadvantages set forth above and in particular has a lower power consumption.

The invention provides a current memory cell comprising a fine MOS memory transistor and a coarse MOS memory transistor connected in series between two power supply rails, an input coupled to the junction of the drain electrodes of the fine and coarse memory transistors via a switch which is closed during a first portion of a clock period, a second switch connected between the gate and drain electrodes of the coarse memory transistor which is closed during a first part of the first portion, a third switch connected between the gate and drain electrodes of the fine memory transistor which is closed during a second part of the first portion and an output coupled to the junction of the drain electrodes of the coarse and fine memory transistors via fourth switch which is closed during a second portion of the clock period characterised in that means are provided for regulating the voltage applied to the power rails to be substantially equal to the sum of the gate source voltages of the fine and coarse memory transistors.

By providing the regulation of the voltage to the supply rails supplying power to the current memory cell and making it independent of the supply voltage applied to other circuits within an integrated circuit of which the current memory cell forms part, the choice of design parameters for the memory transistors can be made independent of the overall supply voltage.

The voltage regulating means may comprise two further MOS transistors which are diode connected and connected in series, the two further transistors being matched with the coarse and fine transistors, a bias current source, the bias current source being arranged to pass a bias current through the two further transistors, means for sensing the sum of the voltages across the two further transistors, and means for causing the voltage applied to the power rails to be substantially equal to the sensed voltage.

By passing a bias current through the diode connected two further transistors, a supply voltage may be generated which is equal to that required for the current memory cell. Thus the voltage across the two further transistors will be equal to $V_{gsn}+V_{gsp}$.

The sensing means may comprise a first input of a differential amplifier and the causing means may comprise means for coupling the second input and the output of the differential amplifier to one of the supply rails.

The output of the amplifier may be connected to the gate electrode of a fifth transistor whose drain electrode is connected to the one of the supply rails and whose source electrode is connected to a further higher voltage supply rail.

In this way the voltage applied to the supply rails of the current memory cell can be forced to that which appears across the two diode connected transistors.

A plurality of such current memory cells may be provided with a common means for regulating the voltage applied to their power rails. Thus a complete switched current signal processing system can have supply rails whose voltage is regulated by means of a single voltage regulating circuit.

BRIEF DESCRIPTION OF THE DRAWING

The above and other features and advantages of the invention will be apparent from the following description, by way of example, of an embodiment of the invention with reference to the accompanying drawings, in which.

DESCRIPTION OF THE PREFERRED EMBODIMENTS

Figure 1:
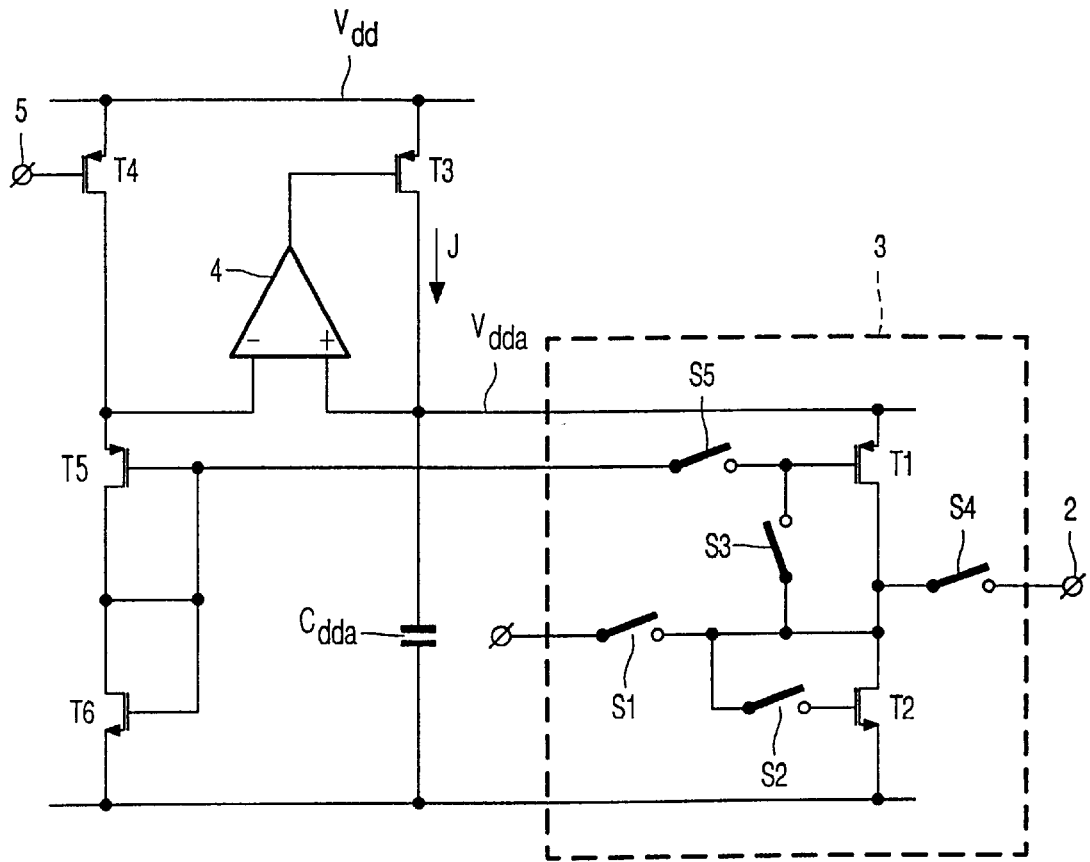
FIG. 1 is a circuit diagram of an exemplary embodiment of a switched current memory cell according to the invention.

As shown in FIG. 1 the switched current memory cell according to the invention has an input 1 to which, in operation, an input current is applied and an output 2 at which the stored input current may be made available. The input 1 is connected via a switch S1 to the junction of a second switch S2 and a third switch S3. This junction is further connected to the junction of the drain electrodes of a P-channel field effect transistor T1 and an N-channel field effect transistor T2. The other end of the switch S2 is connected to the gate electrode of the transistor T2, while the other end of the switch S3 is connected to the gate electrode of transistor T1. The source electrode of transistor T2 is connected to a power supply rail $V_{SS}$. The junction of the drain electrodes of transistors T1 and T2 is further connected via a switch S4 to the output 2. The gate of transistor T1 is further connected via a switch S5 to the gate electrode of a p-channel field effect transistor T5 at which a bias potential is developed, while the source electrode of transistor T1 is connected to a second supply rail $V_{dda}$. The circuit thus far described comprises a switched current memory cell as disclosed in the aforementioned European Patent Application.

The supply rail $V_{dda}$ is connected via a P-channel field effect transistor T3 to a supply rail $V_{dd}$ and to the non inverting input of a differential amplifier 4. The output of the amplifier 4 is connected to the gate electrode of transistor T3. The series arrangement of first and second P-channel field effect transistor T4 and T5 and an N-channel field effect transistor T6 is connected between the supply rails $V_{dd}$ and $V_{SS}$. The gate electrode of transistor T4 is connected to a terminal 5 to which, in operation, a reference voltage $V_{ref}$ is applied. The gate electrode of transistor T5 is connected to its drain electrode while the gate electrode of transistor T6 is connected to its drain electrode. Thus transistors T5 and T6 form series connected diodes. The junction of the drain electrodes of transistors T4 and T5 is connected to the inverting input of the differential amplifier 4. The junction of the diodes formed by transistors T5 and T6 is connected to one end of the switch S5.

In operation, the combination of transistors T4, T5 and T6 generates voltages having the values required by the memory cell 3. The bias current J required in the memory cell 3 is first generated in transistor T4 by the application of the bias voltage $V_{ref}$ and this current will also flow in transistors T5 and T6. Transistor T5 is constructed to be identical to transistor T1 while transistor T6 is constructed to be identical to transistor T2. Transistors T5 and T6 are both diode connected and so the voltage generated at the inverting input of the amplifier 4 is $V_x$, where $V_x = V_{gsn} + V_{gsp}$. That is, $V_x$ has the value required for supplying the voltage $V_{dda}$ to the switched current memory cell 3. The voltage at the gate electrode of transistor T5 is $V_y$, where $V_y = V_x - V_{gsp}$. That is, the voltage $V_y$ has the value required to bias the memory cell with a current J when the supply voltage is $V_{dda}$. The voltage at the non inverting input of amplifier 4 is forced to the voltage at its inverting input by the action of the negative feed-back loop formed by the amplifier 4 and transistor P3.

During operation of the current memory cell on the input phase $\phi 1a$ the amplifier 4 adjusts the gate voltage of transistor T3 and hence the current supplied to the current memory cell until $V_{dda}$ is equal to $V_x$. This will define a drain current in transistor T3 of J. As a result transistor T3 should be dimensioned such that its saturation voltage at this drain current is less than the difference between the voltage $V_{dd}$ and $V_{dda}$. During the phase $\phi 1b$, the fine memory transistor T1 is diode connected and draws a similar current from the $V_{dda}$ rail. On the following output phase $\phi 2$ the current flowing in $V_{dda}$ will again be similar. In practice small fluctuations in this current occur throughout the cycle due to the transistor non idealities and these may be absorbed by a decoupling capacitor $C_{dda}$.

Figure 2:
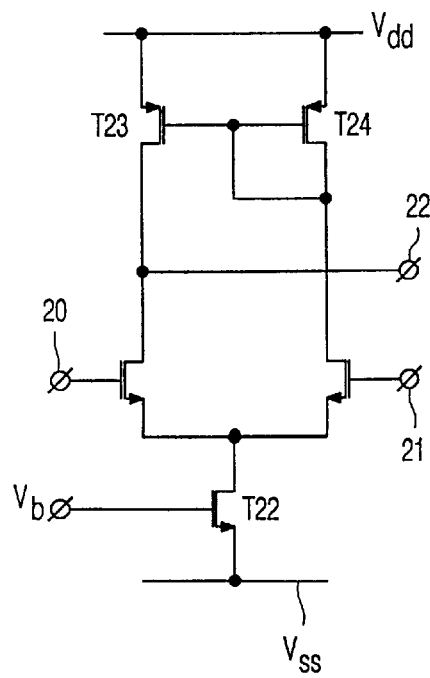
FIG. 2 is a circuit diagram of a differential amplifier suitable for use in the switched current memory cell of FIG. 1

FIG. 2 is a circuit diagram of a differential amplifier suitable for use as the amplifier 4 in FIG. 1. As shown in FIG. 2 the differential amplifier has an inverting input 20 and a non inverting input 21. The inverting input is fed to the gate electrode of an N-channel field effect transistor T20, while the input 21 is connected to the gate electrode of an N-channel field effect transistor T21. The source electrodes of transistors T20 and T21 are commoned and connected to the drain electrode of an N-channel field effect transistor T22. A bias voltage $V_b$ is connected to the gate electrode of transistor T22, while its source electrode is connected to a power rail $V_{SS}$. The drain electrode of transistor T20 is connected to the drain electrode of a P-channel field effect transistor T23 and to an output 22. The source electrode of transistor T23 is connected to a power rail $V_{dd}$. The drain electrode of transistor T21 is connected to the drain and gate electrode of a P-channel field effect transistor T24 whose source electrode is connected to the supply rail $V_{dd}$. The gate electrode of transistor T23 is connected to the gate electrode of transistor T24.

This is a simple form of differential amplifier, the transistor T22 providing a current source to feed the tail of the differential pair formed by transistors T20 and T21. In operation the input 20 is connected to the junction of the drain electrodes of transistors T4 and T5 of FIG. 1, while the input 21 is connected to the rail $V_{dda}$. The output 22 is connected to the gate electrode of transistor T3.

Figure 3:
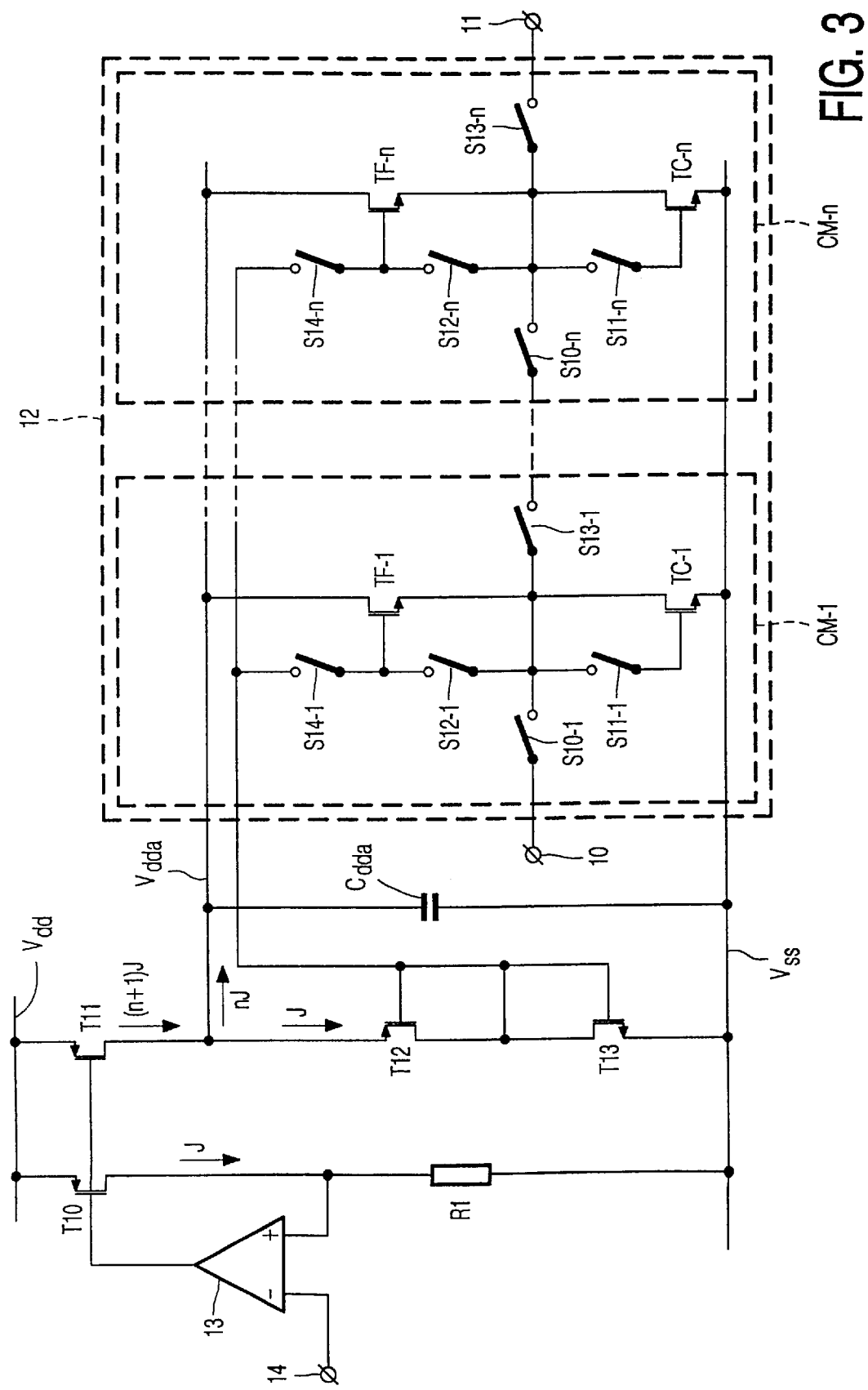
FIG. 3 is a circuit diagram of an exemplanary embodiment of a switched current signal processing arrangement according to the invention.

FIG. 3 shows an embodiment of a switched current signal processing arrangement according to the invention. It comprises an input 10 which is arranged to receive an input signal in the form of current samples and an output 11 at which an output signal in the form of current samples is made available. Within a signal processing block 12 a plurality of current memories CM-1 to CM-n are provided which are interconnected to form desired structure for signal processing, for example comprising integrators, delay lines, differentiators, etc. The example shown depicts a delay line but many other structures are possible, as for example disclosed in the text book entitled "Switched Currents—an analogue technique for digital technology" edited by C. Toumazou, J. B. Hughes and N. C. Battersby and published by Peter Peregrinus Ltd., and will be apparent to those skilled in the art. The current memory circuits CM-1 to CM-n and possibly also other circuits such as current scaling circuits are connected between two supply rails $V_{SS}$ and $V_{dda}$. Each of the current memory circuits CM comprises a coarse memory transistor TC and a fine memory transistor TF together with associated switches S10, S11, S12, S13, and S14. For an explanation of the construction and operation of these current memories reference may be made to EP-A-608936.

In order to produce the correct operating voltage $V_{dda}$ for the switched current signal processing circuit 12 a biasing circuit comprising transistors T10 to T13, a differential amplifier 13, and a resistor R1 is provided as shown in FIG. 3. A terminal 14 is connected to the inverting input of the amplifier 13 and, in operation, a reference voltage $V_{ref}$, which may be equal to $V_{dd}/2$, is applied to terminal 14. The output of amplifier 13 is connected to the gate electrodes of the p-channel field effect transistors T10 and T11 whose source electrodes are connected to the supply rail $V_{dd}$. The drain electrode of transistor T10 is connected to the non-inverting input of amplifier 13 and via a resistor R to the supply rail $V_{SS}$. The drain electrode of transistor T11 is connected to the source electrode of the p-channel field effect transistor T12 whose drain electrode is connected to the drain electrode of the n-channel field effect transistor T13. The drain and gate electrodes of transistor T12 are commoned and connected to the gate electrode of transistor T13. The source electrode of transistor T13 is connected to the supply rail $V_{SS}$. Thus transistors T12 and T13 are connected as diodes and the voltage generated at their junction is used to bias the fine memory transistors TF-1 to TF-n during phase $\phi 1a$ or $\phi 2a$ of the current memory clock.

In operation, the reference voltage $V_{ref}$ if applied to terminal 14 and the action of the amplifier causes the voltage at the drain electrode of transistor T10 to tend towards $V_{ref}$ and thus a current $J=V_{ref}/R$ is generated by the current source comprising transistor T10. This current is mirrored in transistor T11 which is constructed so that it generates the current (n+1) J, where nJ is the bias current required by the totality of circuits within the processing arrangement 12. The additional current J is passed through the diode connected transistors T12 and T13 to generate the bias voltage required by each fine memory transistor.

Where a plurality of current memory cells are connected to the rail $V_{dda}$ a capacitor $C_{dda}$ is connected across the supply rails $V_{dda}$ and $V_{SS}$. This smooths out any small fluctuations in current which occur due to the switching action in the current memory cells.

This description has shown how the supply rail $V_{dda}$ may be produced for an individual current memory cell (FIG. 1) and how such an arrangement can be extended to a general signal processing circuit using such current memory cells (FIG. 3), the current memory cells being interconnected in any desired way to produce functions such as for example integration or differentiation to enable systems such as filters to be constructed. For examples of switched current integrators in which such current memory cells could be used reference may be made to, interalia, EP-A-0412609 (PHB33577), EP-A-0642095 (PHB 33873), and EP-A-0789921 (PHB 34006). For examples of switched current differentiators in which such current memory cells could be used reference may be made to, interalia, EP-A-0416 699 (PHB33584) and EP-A-0750771 (PHB 33967). In addition, for further examples of switched current signal processing circuits in which the current memory circuit of the present invention may be incorporated readers are referred to the text book "SWITCHED-CURRENTS an analogue technique for digital technology" edited by C. Toumazou, J. B. Hughes and N. C. Battersby, published by Peter Peregrinus Ltd. in 1993 (ISBN 0 86341 294 7). Clearly the circuit may be inverted in polarity by substituting p and n-channel devices and differential circuits may be constructed by utilising circuits of both polarities. The form of the differential amplifier 4 may be any convenient construction, the only requirement being that it fulfils the function of enabling the correct power supply voltages to be generated.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A current memory cell comprising a fine MOS memory transistor and a coarse MOS memory transistor connected in series between two power supply rails, an input coupled to the junction of the drain electrodes of the fine and coarse memory transistors via a switch which is closed during a first portion of a clock period, a second switch connected between the gate and drain electrodes of the coarse transistor which is closed during a first part of the first portion, a third switch connected between the gate and drain electrodes of the fine memory transistor which is closed during a second part of the first portion, and an output coupled to the junction of the drain electrodes of the coarse and fine memory transistors via a fourth switch which is closed during a second position of the clock period characterised by further comprising:

a voltage regulating circuit which regulates the voltage applied to the power rails to be substantially equal to the sum of the gate-source voltages of the fine and coarse memory transistors, the voltage regulating circuit including two further MOS transistors which are diode connected and connected in series, the two further transistors being matched with the coarse and fine memory transistors, a bias current source, the bias current source being arranged to pass a bias current through the two further transistors, a sense device which senses the sum of the voltages across the two further transistors, and a first device which causes the voltage applied to the power rails to be substantially equal to the sensed sum of the voltages sensed by the sensing device.

2. A current memory cell as claimed in claim 1, in which the sense device comprises a first input of a differential amplifier, and the first device comprises means for coupling the second input and the output of the differential amplifier to one of the supply rails.

3. A current memory cell as claimed in claim 2 in which the output of the amplifier is connected to the gate electrode of a fifth transistor whose drain electrode is connected to the one of the supply rails and whose source electrode is connected to a further higher voltage supply rail.

4. A switched current signal processing arrangement comprising: a plurality of current memory cells, each memory cell including a fine MOS memory transistor and a coarse MOS memory transistor connected in series between two power supply rails, an input coupled to the junction of the drain electrodes of the fine and coarse memory transistors via a switch which is closed during a first portion of a clock period, a second switch connected between the gate and drain electrodes of the coarse transistor which is closed during a first part of the first portion, a third switch connected between the gate and drain electrodes of the fine memory transistor which is closed during a second part of the first portion, and an output coupled to the junction of the drain electrodes of the coarse and fine memory transistors via a fourth switch which is closed during a second position of the clock period; and a voltage regulating circuit common to the plurality of memory cells for regulating the voltage applied to their power supply rails to be substantially equal to the sum of the gate-source voltages of the fine and coarse memory transistors, the voltage regulating circuit including two further MOS transistors which are diode connected and connected in series, the two further transistors being matched with the coarse and fine memory transistors, a bias current source, the bias current source being arranged to pass a bias current through the two further transistors, a sense device which senses the sum of the voltages across the two further transistors, and a first device which causes the voltage applied to the power rails to be substantially equal to the sensed sum of the voltages sensed by the sensing device.

5. A switched current signal processing arrangement according to claim 4, in which the sense device comprises a first input of a differential amplifier, and the first device means comprises means for coupling the second input and the output of the differential amplifier to one of the supply rails.

6. A switched current signal processing arrangement according to claim 5 in which the output of the amplifier is connected to the gate electrode of a fifth transistor whose drain electrode is connected to the one of the supply rails and whose source electrode is connected to a further higher voltage supply rail.

7. An integrated circuit, comprising:

first power supply rails for powering at least one circuit of the integrated circuit;

a first voltage regulating circuit for regulating the voltage on the power supply rails at a first voltage;

a memory circuit including second, memory power supply rails and a plurality of memory cells, each memory cell including a fine MOS memory transistor and a coarse MOS memory transistor connected in series between the second power supply rails, an input, a first switch coupling the input to a junction of the drain electrodes of the fine and coarse memory transistors which first switch is closed during a first portion of a clock period, a second switch connected between gate and drain electrodes of the coarse transistor which second switch is closed during a first part of the first portion of the clock period, a third switch connected between gate and drain electrodes of the fine memory transistor which third switch is closed during a second part of the first portion of the clock period, an output, and a fourth switch coupling a junction of drain electrodes of the coarse and fine memory transistors which fourth switch is closed during a second portion of the clock; and a second, memory voltage regulating circuit common to the plurality of memory cells for regulating the voltage applied to the memory power supply rails to be substantially equal to the sum of the gate-source voltages of the fine and coarse memory transistors and different than the first voltage.

8. An integrated circuit as claimed in claim 7, in which the second, memory voltage regulating circuit comprises two further MOS transistors which are diode connected and connected in series, the two further transistors being matched with the coarse and fine memory transistors, a bias current source, the bias current source being arranged to pass a bias current through the two further transistors, a sense device which senses the sum of the voltages across the two further transistors, and a first device which causes the voltage applied to the power rails to be substantially equal to the sensed sum of the voltages sensed by the sensing device.

9. An integrated circuit as claimed in claim 8, in which the sense device comprises a first input of a differential amplifier, and the first device comprises means for coupling the second input and the output of the differential amplifier to one of the supply rails.

10. An integrated circuit as claimed in claim 9, in which the output of the amplifier is connected to the gate electrode of the fifth transistor whose drain electrode is connected to the one of the supply rails and whose source electrode is connected to a further higher voltage supply rail.

11. A method of operating an integrated circuit having first supply rails to supply power to at least a first circuit of the integrated circuit, and a memory, said method comprising:

regulating the voltage of the first supply rails at a first voltage; and regulating the voltage of a second set supply rails which supply the memory at a second, different voltage.

12. A method according to claim 11, wherein said memory includes a plurality of memory cells, each memory cell including a fine MOS memory transistor and a coarse MOS memory transistor connected in series between the second supply rails, an input, a first switch coupling the input to a junction of the drain electrodes of the fine and coarse memory transistors which first switch is closed during a first portion of a clock period, a second switch connected between gate and drain electrodes of the coarse transistor which second switch is closed during a first part of the first portion of the clock period, a third switch connected between gate and drain electrodes of the fine memory transistor which third switch is closed during a second part of the first portion of the clock period, an output, and a fourth switch coupling a junction of drain electrodes of the coarse and fine memory transistors which fourth switch is closed during a second portion of the clock, and said step of regulating the voltage of the second supply rails regulates the voltage thereof to be substantially equal to the sum of the gate-source voltages of the fine and coarse memory transistors.

* * * * *